(12) United States Patent
Takao

(10) Patent No.: US 7,913,195 B2
(45) Date of Patent: Mar. 22, 2011

(54) METHOD FOR CREATING MASK LAYOUT DATA, APPARATUS FOR CREATING MASK LAYOUT DATA, AND METHOD FOR MANUFACTURING SEMICONDUCTOR DEVICE

(75) Inventor: Yoshihiro Takao, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 543 days.

(21) Appl. No.: 12/026,753

(22) Filed: Feb. 6, 2008

(65) Prior Publication Data
US 2008/0282217 A1 Nov. 13, 2008

(30) Foreign Application Priority Data
Feb. 7, 2007 (JP) ................. 2007-027605

(51) Int. Cl.
G06F 17/50 (2006.01)
G06F 19/00 (2011.01)
H01L 21/00 (2006.01)

(52) U.S. Cl. .............. 716/51; 716/53; 716/55; 716/119; 700/98; 700/120; 700/121; 438/45; 438/217; 438/289; 438/369; 438/510

(58) Field of Classification Search .............. 716/21, 716/2, 3, 51, 53, 55, 119; 700/98, 120, 121; 438/45, 217, 289, 369, 510
See application file for complete search history.

(56) References Cited

U.S. PATENT DOCUMENTS

| | | | |
|---|---|---|---|
| 5,091,324 A | 2/1992 | Hsu et al. | |
| 6,586,264 B2* | 7/2003 | Usujima | 438/14 |
| 7,649,777 B2* | 1/2010 | Ichige et al. | 365/185.17 |
| 7,683,414 B2* | 3/2010 | Nagano et al. | 257/296 |
| 7,793,240 B2* | 9/2010 | Sultan et al. | 716/136 |
| 2004/0227563 A1* | 11/2004 | Kuroda | 327/530 |
| 2008/0104550 A1* | 5/2008 | Sultan et al. | 716/2 |
| 2009/0134436 A1* | 5/2009 | Nagano et al. | 257/291 |

FOREIGN PATENT DOCUMENTS

| | | |
|---|---|---|
| JP | 4-255266 A | 9/1992 |
| JP | 2002-299611 A | 10/2002 |

\* cited by examiner

Primary Examiner — Phallaka Kik
(74) Attorney, Agent, or Firm — Fujitsu Patent Center

(57) ABSTRACT

According to mask layout data created for a particular factory facility, transistors constituting a semiconductor device are classified into multiple groups depending on the gate length. Thereafter, the concentration of impurity introduced into a channel layer is set for each group, and thereby the gate length-threshold characteristics of a transistor are controlled. An overlapping area of a gate electrode and an element region of a certain group is extracted from mask layout data. The overlapping area is expanded to determine the shape of a mask used in injecting impurity in a channel layer. The data on the mask shape is then added to the mask layout data.

10 Claims, 6 Drawing Sheets

METHOD FOR CREATING MASK LAYOUT DATA, APPARATUS FOR CREATING MASK LAYOUT DATA, AND METHOD FOR MANUFACTURING SEMICONDUCTOR DEVICE

CROSS-REFERENCE TO RELATED APPLICATIONS

This application is based on and claims priority of Japanese Patent Application No. 2007-027605 filed on Feb. 7, 2007, the entire contents of which are incorporated herein by reference.

BACKGROUND OF THE INVENTION

1. Field of the Invention

The present invention relates to a mask layout data creation method and a mask layout data creating apparatus with each of which mask layout data created for a particular factory facility is used to create mask layout data optimized for another factory facility, as well as a method for manufacturing a semiconductor device using the created mask layout data.

2. Description of the Prior Art

In manufacturing a semiconductor device (Large Scale Integration: LSI), circuit designing is first carried out based on a required specification. Thereafter, mask layout data is created based on the data used in the circuit designing. Subsequently, the created mask layout data is used to make a reticle. Then, the reticle is used to transfer a pattern to a semiconductor substrate, thereby a semiconductor device being manufactured. In general, software (an electronic circuit simulator) called SPICE is used in circuit design. The mask layout data is described in a format called GDS.

The circuit of a semiconductor device is usually designed by a circuit design department using its company's in-house design standard (SPICE parameter), and the semiconductor device is manufactured using the circuit design data by a manufacturing department of a company's in-house factory. However, when there is a need for an urgent increase in manufacturing of the semiconductor devices manufactured in a company's in-house factory, a problem arises that an expansion of the facility in the company's in-house factory requires not only enormous investment but also a long period of time before a semiconductor device can actually be manufactured in a newly constructed facility. Also, a problem arises that various risks are generated with the starting up of the new facility.

For this reason, in some cases, a manufacturing of semiconductor devices is outsourced (to another company). In this case, the company's in-house design standard (SPICE parameter) naturally differs from that of the other company. As a result, even when the same mask layout data (GDS data) is used to manufacture the semiconductor device, variation occurs in the characteristics of transistors which constitute semiconductor devices.

Figure 1:
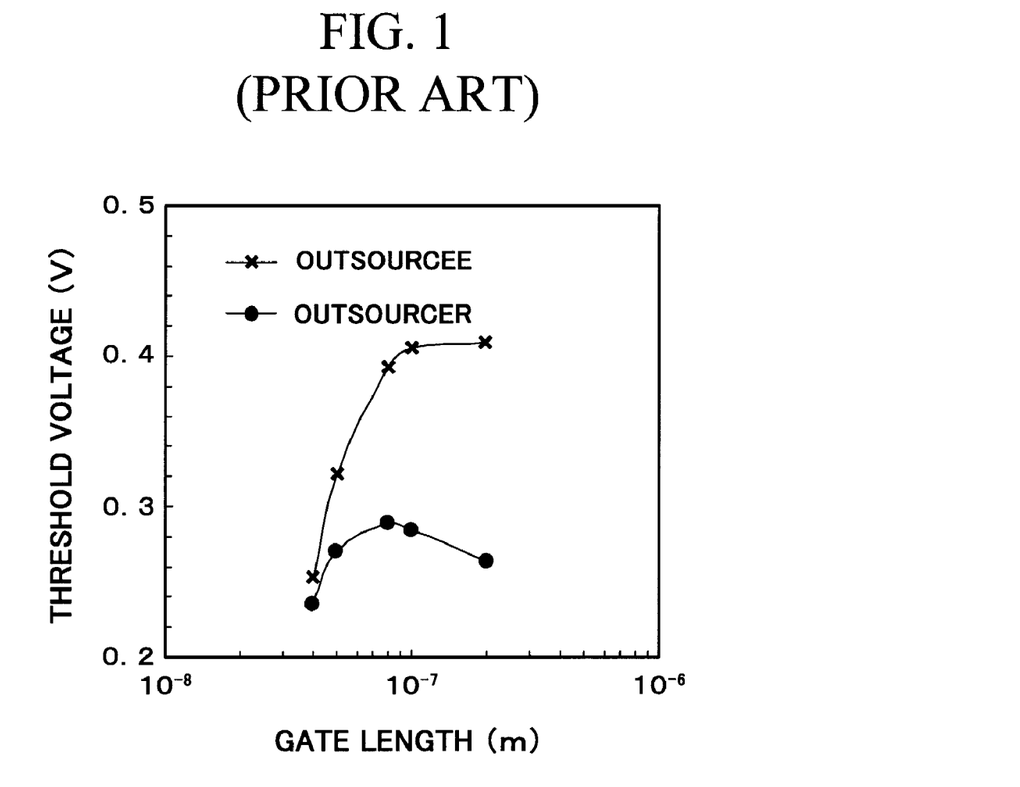
FIG. 1 shows an example of the characteristics (gate length-threshold voltage characteristics) of the transistor manufactured by an outsourcer, and an example of the transistor manufactured by an outsourcee (contractor) in combination.

FIG. 1 shows an example of the characteristics (gate length-threshold voltage characteristics) of a transistor manufactured by an outsourcer together with an example of the characteristics of a transistor manufactured by an outsourcee (contractor) in combination. As described above, the respective companies have different design standards. Thereby, even when the same mask layout data is used, there is a difference between the characteristics of the transistors manufactured by the outsourcer and by the outsourcee. The characteristics of a transistor is related not only to a gate length but also to a junction depth of an extension layers, the thickness of a gate insulation film, the width of a side wall, the concentration of impurity in a channel layer, and the like. Accordingly, these parameters have so far been controlled so that the characteristics of the transistor manufactured by an outsourcee can become close to the characteristics of the transistor manufactured by an outsourcer.

Japanese Laid-open Patent Application Publication No. Hei 4-255266 describes an optimization of characteristics by introducing impurity into portions which serve as the channels of an intrinsic MOS transistor, a long channel MOS transistor, and a short channel MOS transistor. In addition, in a method described in Japanese Laid-open Patent Application Publication No. 2002-299611, the impurity injection conditions for a transistor having a particular gate length are decided, the concentration of impurity of the transistor is calculated, and then the concentration of impurity of a transistor having a gate length shorter than the particular gate length is calculated based on the calculation result. Thereby, the characteristics of the transistor are figured out.

As described above, in order that the characteristics of the transistor manufactured by an outsourcee will be made close to the characteristics of the transistor manufactured by an outsourcer, it is necessary to actually manufacture a transistor by controlling various parameters, to measure the characteristics of the manufactured transistors, and then to feed back the measurement results for controlling parameters. However, the above operations are so complicated that a long period of time is consumed to determine the parameters.

Moreover, when the thickness of the gate insulation film becomes thin as a result of controlling the parameters, the breakdown voltage of a transistor becomes low and this reduces the reliability of a semiconductor device. A major change in the processes and the introduction of a new manufacturing facility are further necessary to change the junction depth of the extension layer.

SUMMARY OF THE INVENTION

It is an object of the present invention to provide a mask layout data creating method and a mask layout data creating apparatus, with each of which mask layout data created for a particular factory facility is used to efficiently create mask layout data optimized for another factory facility, as well as a method for manufacturing a semiconductor device by using the mask layout data.

According to an aspect of the present invention, a mask layout data creating method for creating a mask layout data for a second factory facility using a mask layout data for a first factory facility, wherein the method includes a process of extracting an overlapping area of a gate electrode and an element region from the mask layout data for the first factory facility with respect to a transistor having a gate length within a predetermined range, a process of expanding the overlapping area to set an expanded region, and a process of creating a data corresponding to the expanded region to add the created data to the mask layout data for the first factory facility, thereby creating the mask layout data for the second factory facility, is provided.

According to another aspect of the present invention, a mask layout data creating apparatus for creating a mask layout data for a second factory facility using a mask layout data for a first factory facility, wherein the apparatus includes an input section for inputting the mask layout data for the first factory facility, an overlapping area extracting section for extracting an overlapping area of a gate electrode and an element region from the mask layout data for the first factory facility inputted into the input section with respect to a transistor having a gate length within a predetermined range, and a mask layout data correcting section for creating the mask layout data for the second factory facility by expanding the overlapping area extracted by the overlapping area extracting section to set an expanded region, and by creating a data corresponding to the expanded region to add the created data to the mask layout data for the first factory facility, is provided.

According to the still another aspect of the present invention, a semiconductor device manufacturing method, wherein the method includes a selecting process of selecting a first group and a second group based on a gate length from a plurality of transistors constituting a semiconductor device, a first injection process of performing a first channel impurity injection in the semiconductor substrate having the transistors of the first and second groups, a second injection process of performing a second channel impurity injection in the semiconductor substrate having the transistor of the first group, a gate formation process of forming a gate insulation film and a gate electrode on the semiconductor substrate having the transistors of the first and second groups, and a source drain formation process of introducing impurity in the semiconductor substrate located on the both sides of the gate electrode, is provided.

In the present invention, transistors which constitute a semiconductor device are classified into multiple groups based on a gate length. The impurity concentration of a channel layer is controlled for each group to minimize the difference in characteristics between the transistor manufactured in the first factory facility and the transistor manufactured in the second factory facility basically only by the impurity concentration of a channel layer. Therefore, there is no need for changing parameters such as the junction depth of the extension layer, the thickness of a gate insulation film, and the width of the side wall. As a result, a time period consumed before parameters are determined can be reduced.

In the present invention, the overlapping area of a gate electrode having a gate length within a predetermined range and an element region is extracted from the mask layout data for the first factory facility. The overlapping area is expanded in longitudinal and transverse directions. The shape of the expanded region is set to be the shape of the mask used in introducing impurity into the channel layer. Then, the data of the shape (that is, the shape of the mask) of the expanded region is added to the mask layout data for the first factory facility. In such a manner, the mask layout data for the other factory (the second factory facility) facility can easily be created from the mask layout data for the first factory facility.

BRIEF DESCRIPTION OF THE DRAWINGS

FIGS. 3A to 3d are cross-sectional views showing the manufacturing process of a semiconductor device.

DETAILED DESCRIPTION OF THE PREFERRED EMBODIMENTS

An embodiment of the present invention will be described below.

Parameters such as the junction depth of an extension layer, the thickness of a gate insulation film, the width of a side wall, and the impurity concentration in a channel layer have so far been controlled in an outsourcee (the second factory facility) so that the characteristics thereof becomes close to the gate length-threshold voltage characteristics of the transistor manufactured by an outsourcer (the first factory facility). On the contrary, in the present invention, from an aspect that the gate length-threshold voltage characteristics is not necessary to be continuous if the difference between the characteristics of the transistors manufactured by an outsourcer and by an outsourcee is small, transistors constituting a semiconductor device are classified based on a gate length into multiple groups, thereafter setting the impurity concentration in a channel layer respectively in each group to control gate length-threshold voltage characteristics basically only by the impurity concentration in a channel layer.

Figure 2:
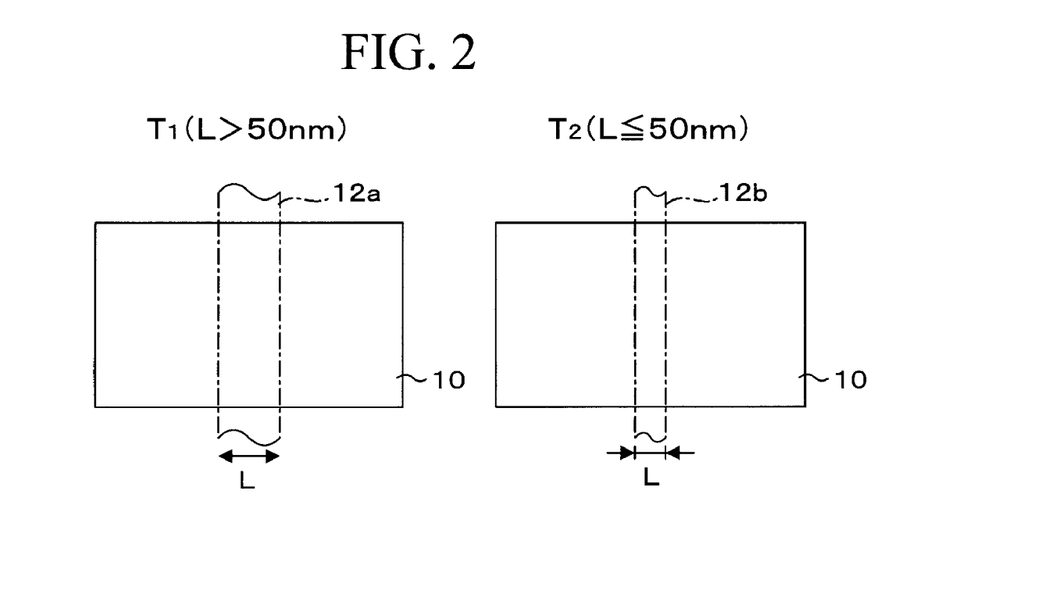
FIG. 2 is a top view showing a semiconductor substrate before impurity is introduced in the channel layer.

Referring to FIGS. 2 and 3, a specific description will be given below. FIG. 2 is a top view showing a semiconductor substrate 10 before impurity (conductive impurity) is introduced in the channel layer. The gate electrodes 12a and 12b indicated by a dashed line in the figure are formed after impurity is introduced into the channel layer. FIGS. 3A to 3D are a cross-sectional view showing the semiconductor device (transistor) manufacturing process in the factory facility of an outsourcee. Here, as shown in FIG. 2, the gate length-threshold voltage characteristics of a transistor T1 having a gate length L of more than 50 nm (L>50 nm), and the gate length-threshold voltage characteristics of a transistor T2 having a gate length L of 50 nm or less (L=50 nm) are considered to respectively controlled. The conduction type of the transistors T1 and T2 is also here considered to be p-type for convenience of description.

First, the data of transistors is extracted from the mask layout data created by an outsourcer. These transistors are then classified into two groups (transistors T1 and T2) based on whether a gate length L is 50 nm or less, or not. On the other hand, a test is previously carried out, thereby determining the impurity concentration C1 of a channel layer so that the characteristics (gate length-threshold voltage characteristics) of the transistor T1 becomes close (equal) to the characteristics of the transistor of an outsourcer (however, the characteristics of a transistor having a gate length L of more than 50 nm), and determining the impurity concentration C2 of a channel layer so that the characteristics of the transistor T2 becomes close (equal) to the characteristics of the transistor of the outsourcer (however, the characteristics of a transistor having a gate length L of 50 nm or less).

Figure 3A:
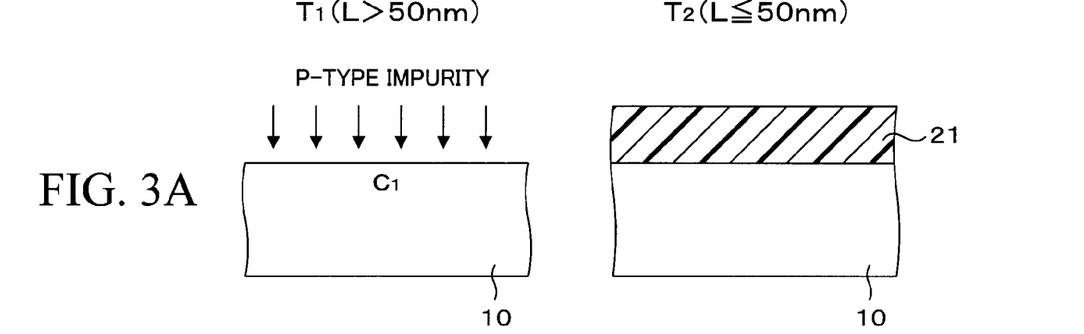

As shown in FIG. 3A, a mask (photoresist film) 21 is then formed on the transistor T2 forming region of a semiconductor substrate 10. And p-type impurity such as boron (B), or indium (In) is introduced in a concentration of C1 into the surface of the semiconductor substrate 10 in the transistor T1 forming region. Thereafter, the mask 21 is removed.

Figure 3B:
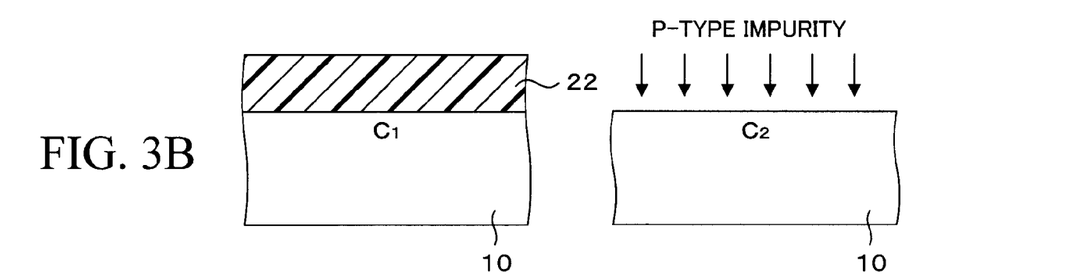

As shown in FIG. 3B, a mask (photoresist film) 22 is then formed on the transistor T1 forming region of a semiconductor substrate 10. And p-type impurity such as boron (B), or indium (In) is introduced in a concentration of C2 into the surface of the semiconductor substrate 10 in the transistor T2 forming region. Thereafter, the mask 22 is removed. In such a manner, the impurity concentration in the channel layer of the transistor T1, and the impurity concentration in the channel layer of the transistor T2 are rendered to be C1 and C2, respectively.

Figure 3C:
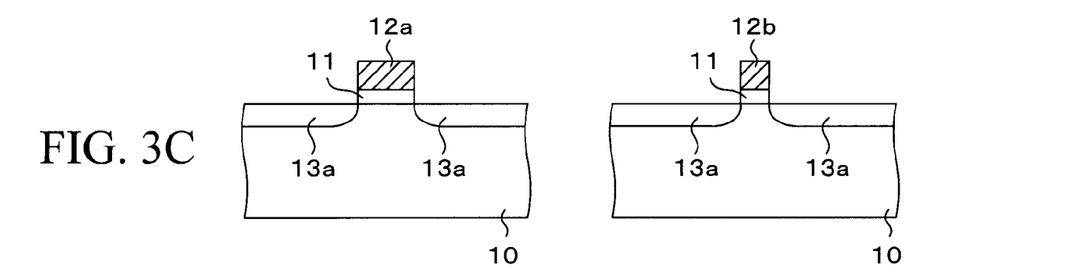
Figure 3D:
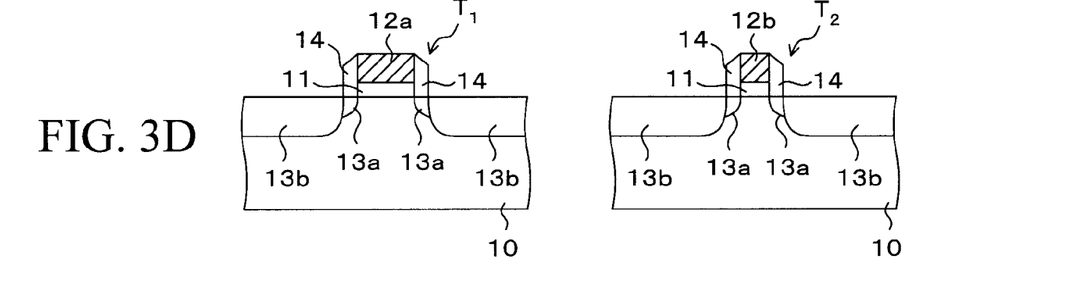

As shown in FIG. 3C, a gate insulation film 11, a gate electrodes 12a and 12b are subsequently formed on the semiconductor substrate 10. And n-type impurity such as phosphorous (P), or arsenic (As) is introduced into the semiconductor substrate 10 using the gate electrodes 12a and 12b as a mask to form an extension layer 13a As shown in FIG. 3D, a side walls 14 are subsequently formed on both sides of the gate electrodes 12a and 12b, respectively. And n-type impurity is introduced into the semiconductor substrate 10 using the gate electrodes 12a and 12b, and side walls 14 as a mask to form source drains 13b. In such a manner, the transistors T1 and T2 are completed. In the present embodiment, parameters other than the impurity concentration of the channel layer, i.e. the thickness of the gate insulation film 11, the junction depth of the extension layer 13a, the width of the side wall 14, the impurity concentration of the source drain 13b, and so forth, are the same as those of the outsourcer.

Figure 4:
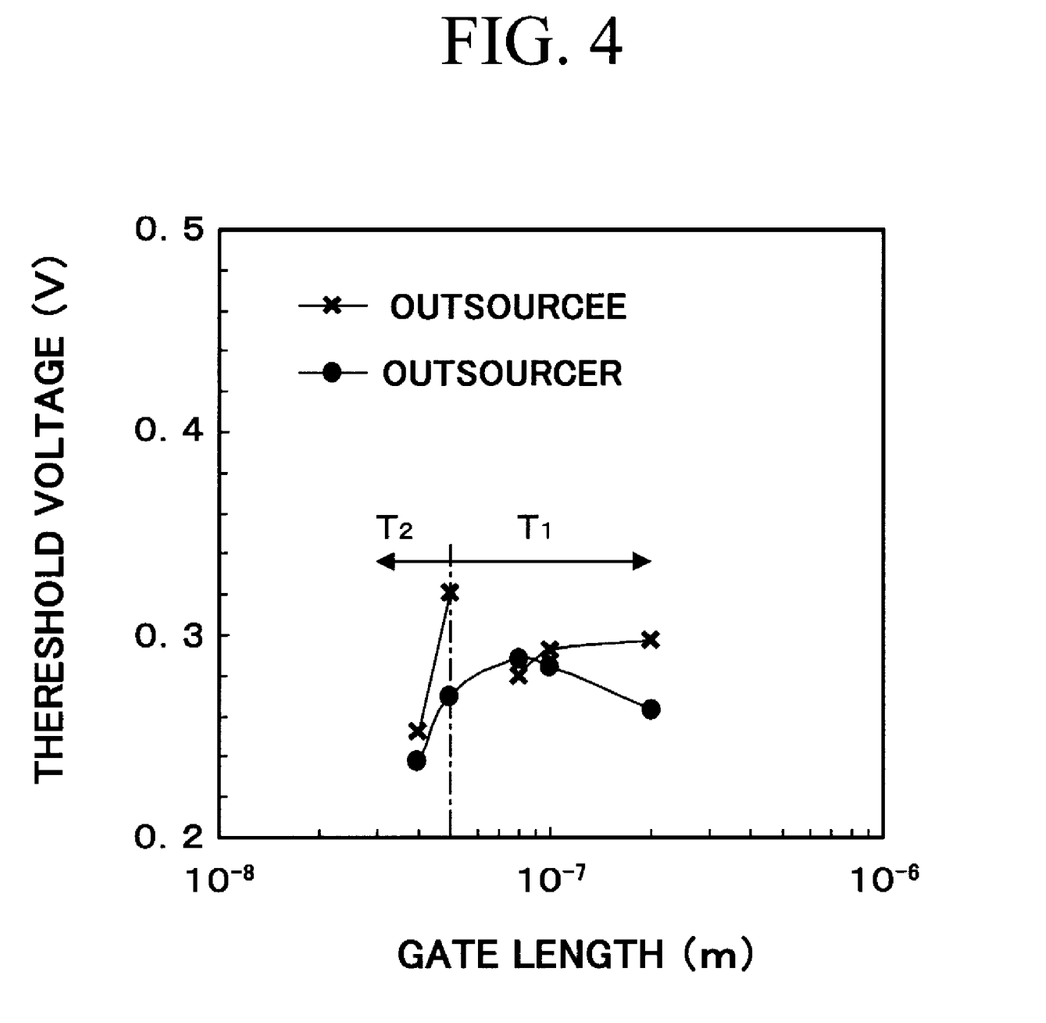
FIG. 4 shows the characteristics of the transistor manufactured by an outsourcer and the characteristics of the transistor manufactured by an outsourcee by applying the present invention.

FIG. 4 shows the characteristics of the transistor of an outsourcer and the characteristics of the transistor manufactured by an outsourcee by applying the present invention. As shown in FIG. 4, a curve showing the relationship between a gate length and a threshold voltage is not continuous with respect to the transistor manufactured by the outsourcee by applying the present invention. However, the difference between the characteristics of the transistors of an outsourcer and an outsourcee is several tens mV at maximum. This is smaller as compared to before (refer to FIG. 1).

In the present embodiment, masks 21 and 22 (refer to FIGS. 3A and 3B) are necessary because, as described above, impurity is selectively introduced into the transistor T1 forming region, or the transistor T2 forming region, respectively. However, the data of the mask for use in the above described process is not included in the mask layout data (GDS data) created by an outsourcer. Therefore, it is necessary to create data for making a mask for use in the above described process from a mask layout data to add the data to the mask layout data.

Figure 5:
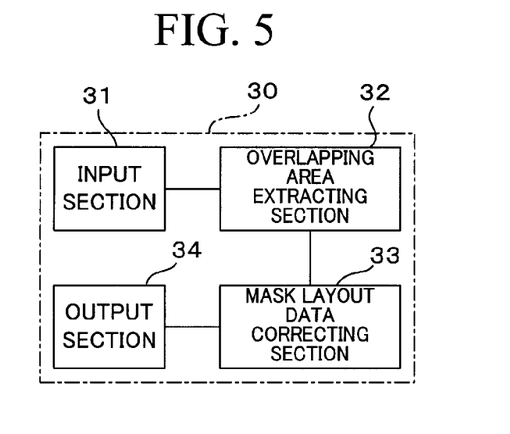
FIG. 5 is a block diagram showing the constitution of a mask layout data creating apparatus related to the embodiment of the present invention.

FIG. 5 is a block diagram showing the constitution of a mask layout data creating apparatus 30 related to the present embodiment of the present invention. The mask layout data creating apparatus 30 of the present embodiment inputs the mask layout data created for a particular factory facility (outsourcer), and outputs the data of the mask pattern used in injecting impurity in the channel layer.

The mask layout data creating apparatus 30 of the present embodiment consists of a computer (workstation) and dedicated software, and includes, as shown in FIG. 5, an input section 31, an overlapping area extracting section 32, a mask layout data correcting section 33, and an output section 34. In the input section 31, the mask layout data (GDS data) created by an outsourcer is inputted. The overlapping area extracting section 32 analyzes the mask layout data inputted from the input section 31 to extract an overlapping area of the gate electrode and element region (active region) of a transistor having a particular gate length or less.

The mask layout data correcting section 33 creates the data of the mask pattern used in injecting impurity in the channel layer using the output of the overlapping area extracting section 32 and then adds the data to the mask layout data created by an outsourcer. Then, the mask layout data added the data is outputted via the output section 34.

The particular gate length is necessary to previously be determined by comparing the characteristics of the transistor manufactured by an outsourcer to the characteristics of the transistor manufactured by an outsourcee using the mask layout data created by the outsourcer. In the present embodiment, an element region is a region where the element of a transistor and the like are formed. Each element region is separated by an element separation film such as STI (Shallow Trench Isolation), or LOCOS (Local Oxidation of Silicon).

Figure 6:
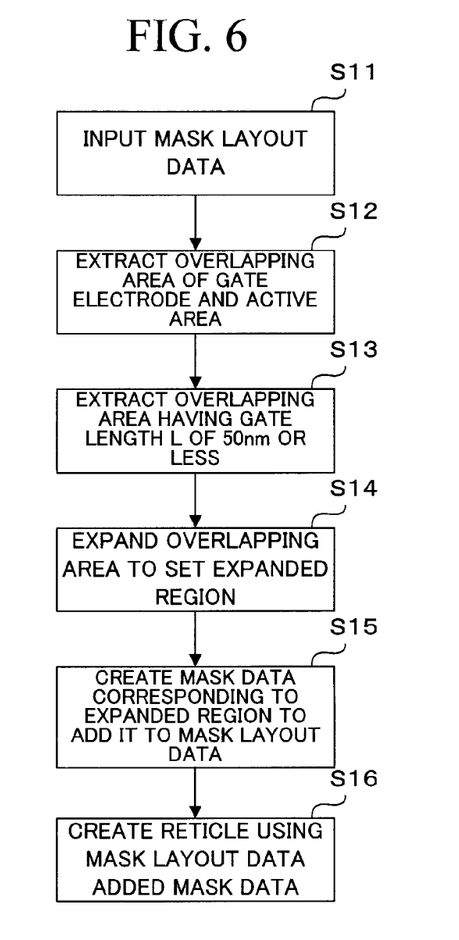
FIG. 6 is a flow chart showing the operations of a mask layout data creating apparatus.
Figure 7:
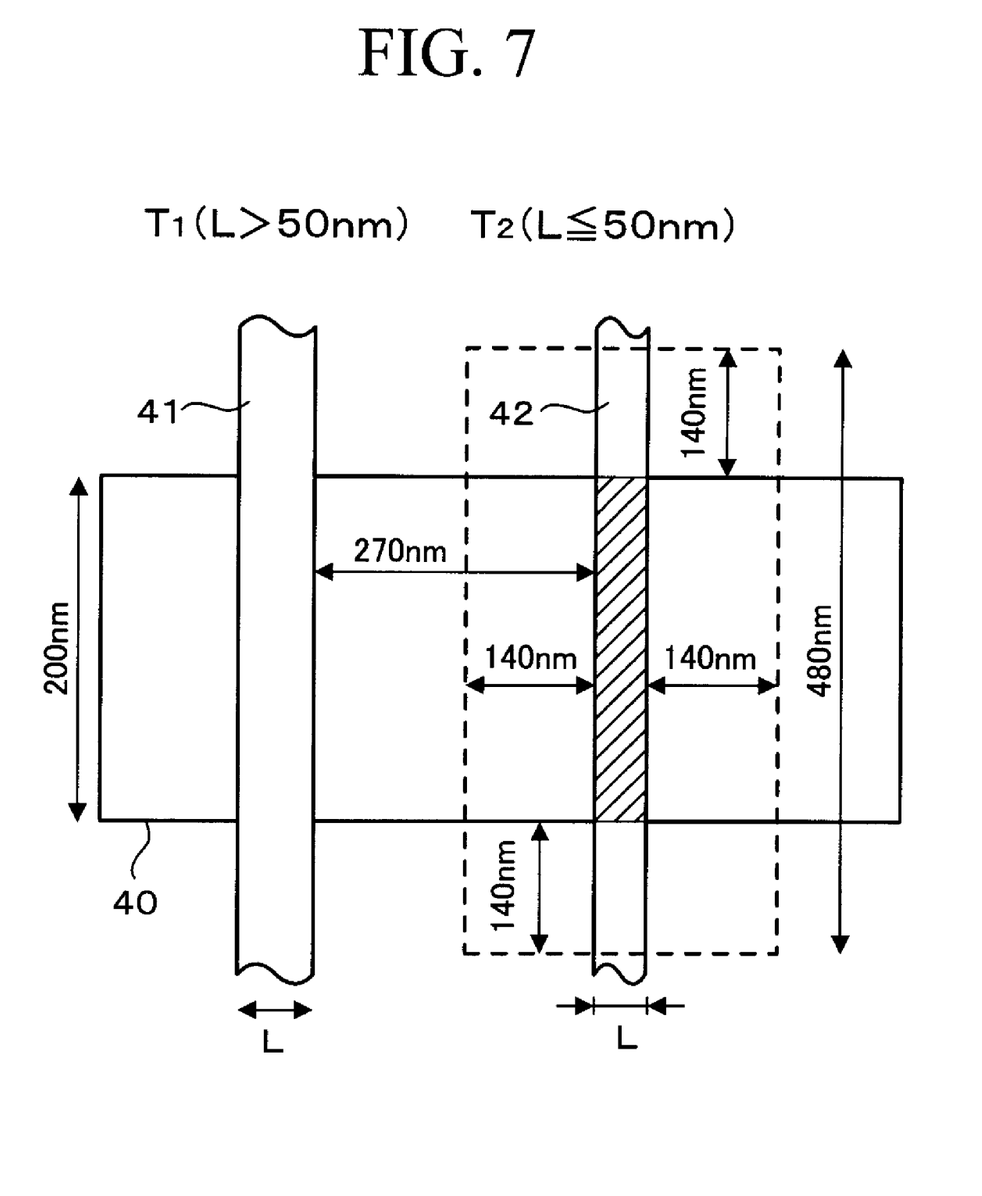
FIG. 7 is a top view of a transistor forming region showing the operations of a mask layout data creating apparatus.

The operations of the above described mask layout data creating apparatus 30 will be described below in greater detail referring to the flow chart shown in FIG. 6, and the top view (diagrammatic drawing) of the transistor forming region shown in FIG. 7. However, as shown in FIG. 7, two transistors T1 and T2 are here considered to be formed in proximity to each other in an element region 40. The gate length (width of a gate electrode 41) L of the transistor T1 is considered to be 80 nm. The gate length (width of a gate electrode 42) L of the transistor T2 is considered to be 50 nm. The distance between the gate electrodes 41 and 42 is considered to be 270 nm. The length of the element region 40 in the longitudinal direction of the gate electrodes 41 and 42 is considered to be 200 nm. Furthermore, transistors constituting a semiconductor device are here considered to be classified into two groups which have a gate length of 50 nm or less, and more than 50 m, respectively.

First, in a step S11, the mask layout data (GDS data) created by an outsourcer is inputted via the input section 31 in the mask layout data creating apparatus 30. Then, the overlapping area extracting section 32 analyzes the mask layout data in a step S12 to extract the overlapping area of the gate electrode and element region (active region) 40 of all transistors.

Then, moving to step a S13, the overlapping area extracting section 32 further extracts the overlapping area (hatched area in FIG. 7) of the gate electrode 42 and element region 40 of the transistor T2 having a gate length L of 50 nm or less from the extracted overlapping area. Then, moving to a step S14, the mask layout data correcting section 33 expands the overlapping area extracted in the step 13 in a transverse direction (horizontal direction), and in a longitudinal direction (vertical direction) to set an expanded region. Here, the distance between the gate electrode 41 of the transistor T1 and the gate electrode 42 of the transistor T2 is 270 nm. Therefore, an about half (140 nm) of the distance is set to be an expansion distance. Then, as shown in a dashed line in FIG. 7, the overlapping area of the gate electrode 42 of the transistor T2 and the element region 40 is expanded by 140 nm both in a transverse direction and in a longitudinal direction to set an expansion distance.

Then, moving to a step S15, the mask layout data correcting section 33 creates the data of a mask for covering the expanded region set in the step S14 (or a mask having an opening corresponding to the expanded region). And the data of the mask is added to the mask layout data created by an outsourcer to output the resultant data as optimized mask data for an outsourcee via the output section 34.

Subsequently, moving to step a S16, a reticle is made based on the mask layout data (GDS data) outputted from the mask layout data creating apparatus 30. The mask layout data is converted to a reticle drawing data to make a reticle using the mask layout data. At this time, a treatment such as the occurrence of a dummy, or Optical Proximity Correction (OPC) is carried out as necessary. In such a manner, the making of the reticle used in a process of introducing impurity into the channel layer of each transistor is completed. Then, using the reticle, the masks 21 and 22 used in the processes shown in FIGS. 3A and 3B are formed.

In the example, a case where the overlapping area of the gate electrode 42 of the transistor T2 having a gate length L of 50 nm or less and the element region 40 is extracted, and the overlapping area is expanded to determine the size of the mask (or the size of the opening of the mask) is described. Alternatively, the overlapping area of the gate electrode 41 of the transistor T1 having a gate length L of more than 50 nm and the element region 40 may be extracted, and the overlapping area is expanded to determine the size of the mask (or the size of the opening of the mask).

In an exposure apparatus, the minimum exposure area is specified. When an exposure area is smaller than the minimum exposure area, a mask cannot be formed in a desired shape. Therefore, it is preferable that the size of the mask (or the size of the opening of the mask) is larger than the minimum exposure area. As an example, a case where the minimum exposure area of the exposure apparatus is $0.12 \, \mu m^2$ will be described. When the overlapping area of the gate electrode 42 and the element region 40 is expanded by 140 nm both in a transverse direction and in a longitudinal direction in the above manner, the area of the mask is $0.16 \, \mu m^2$ ($0.33 \, \mu m \times 0.48 \, \mu m$). In this case, the mask can be formed in a desired shape because the exposure area is larger than the minimum exposure area of the exposure apparatus. When the distance between the gate electrode 41 of the transistor T1 and the gate electrode 42 of the transistor T2 is small, the expansion distance in the transverse direction (horizontal direction) should be reduced, and the expansion distance in the longitudinal direction (vertical direction) should be increased.

Furthermore, in the example, a case where the transistors constituting a semiconductor device are classified into two groups, one having a gate length of 50 nm or less and the other having a gate length of more than 50 nm, respectively, is described. The transistors constituting a semiconductor device may be classified into three or more groups based on a gate length to set the impurity concentration in the channel layer for each group.

According to the present embodiment, the mask layout data optimized for the factory facility of an outsourcee can be obtained only by processing the mask layout data (GDS data) created by an outsourcer with the mask layout data creating apparatus 30. A time period required, to produce a semiconductor device in an outsourcee can significantly be reduced as compared to before. It also becomes possible to easily produce a semiconductor device having uniform characteristics using a factory facility having a different design standard. In the present embodiment, problems, including the reduction in reliability of a semiconductor device with the reduction in the thickness of the gate insulation film, and the drastic modification of the process and the introduction of a new facility with the change in the junction depth of the extension layer and so forth, are further avoided because parameters other than the impurity concentration of the channel layer are not necessary to be changed.

Modification Example

In the embodiment, as shown in FIGS. 3A and 3B, two photolithography processes are necessary to cause the impurity concentrations of the channel regions of the transistors T1 and T2 to be C1 and C2, respectively. Alternatively, it is also possible to cause the impurity concentrations of the channel regions of the transistors T1 and T2 to be C1 and C2, respectively, through one photolithography process. The method will be described below.

Figure 8A:
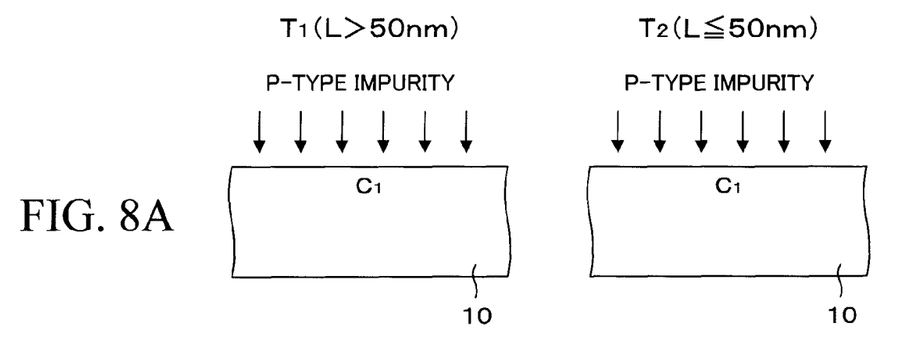
FIGS. 8A and 8B show a modification example 1 of a method for impurity introduction into the channel layers of transistors T1 and T2.
Figure 8B:
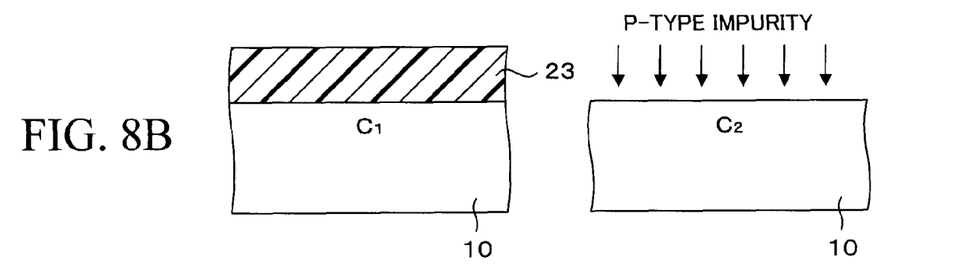

FIGS. 8A and 8B are cross-sectional view showing a method for introducing impurity into the channel layers of the transistors T1 and T2 related to Modification example 1. The conduction type of the channel layer of the transistors T1 and T2 is here considered to be p-type for convenience of description.

As shown in FIG. 8A, p-type impurity is first introduced in a concentration of C1 into the surface of the semiconductor substrate 10 in the transistors T1 and T2 forming region. Thereafter, as shown in FIG. 8B, a mask (photoresist film) 23 is formed in the transistor T1 forming region. Then, p-type impurity is further introduced into the surface of the semiconductor substrate 10 in the transistor T2 forming region to cause the impurity concentration in the channel layer in the transistor T2 forming region to be C2. In such a manner, through one photolithography process, a channel layer having an impurity concentration of C1 and a channel layer having an impurity concentration of C2 can be formed.

Figure 9A:
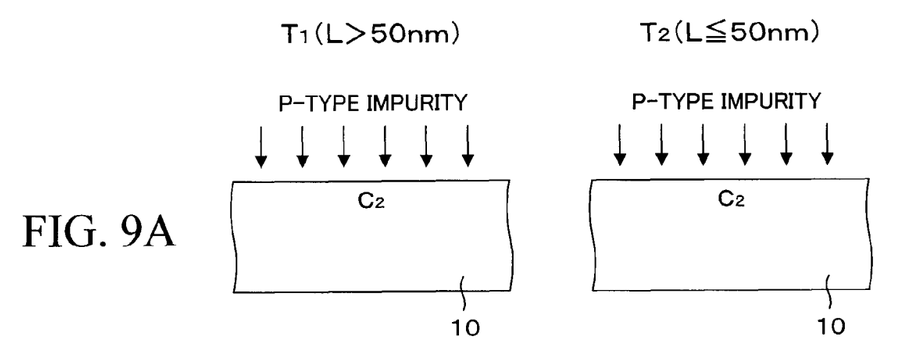
FIGS. 9A and 9B show a modification example 2 of a method for impurity introduction into the channel layers of transistors T1 and T2.
Figure 9B:
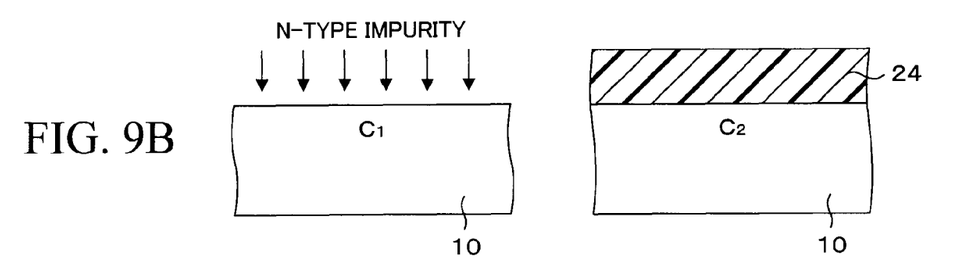

FIGS. 9A and 9B are a cross-sectional view showing a method for introducing impurity into the channel layers of the transistors T1 and T2 related to Modification example 2. The conduction type of the channel layer of the transistors T1 and T2 is here, too, considered to be p-type for convenience of description.

As shown in FIG. 9A, p-type impurity is first introduced in a concentration of C2 into the surface of the semiconductor substrate 10 in the transistors T1 and T2 forming regions. Thereafter, as shown in FIG. 9B, a mask (photoresist film) 24 is formed on the transistor T2 forming region. Then, n-type impurity is further introduced into the surface of the semiconductor substrate 10 in the transistor T1 forming region to cause the impurity concentration in the channel layer in the transistor T1 forming region to be C1. In such a manner, through one photolithography process, a channel layer having an impurity concentration of C1 and a channel layer having an impurity concentration of C2 can be formed.

What is claimed is:

1. A mask layout data creation method of creating a second mask layout data for a second mask by using a first mask layout data for a first mask, comprising:
   extracting, from the first mask layout data, an overlapping area of a gate electrode and an element region with respect to a transistor having a gate length within a predetermined range;
   expanding the overlapping area to generate an expanded region; and
   creating, by a computer, the second mask layout data by creating a data corresponding to the expanded region, and by adding the created data to the first mask layout data.

2. The mask layout data creation method according to claim 1, wherein an expanded distance of the expanded region is a half of a distance between gate electrodes of transistors formed in a same element region.

3. The mask layout data creation method according to claim 1, wherein a size of the expanded region is not less than a minimum exposure area of an exposure apparatus using a reticle formed from the second mask layout data.

4. A mask layout data creating apparatus for creating a second mask layout data for a second mask by using a first mask layout data, comprising:

an input section for inputting the first mask layout data;

an overlapping area extracting section for extracting, from the first mask layout data inputted into the input section, an overlapping area of a gate electrode and an element region with respect to a transistor having a gate length within a predetermined range; and a mask layout data correcting section for creating the second mask layout data by expanding the overlapping area extracted by the overlapping area extracting section to generate an expanded region, by creating a data corresponding to the expanded region, and by adding the created data to the first mask layout data.

5. The mask layout data creating apparatus according to claim 4, wherein the mask layout data correcting section sets an expanded distance of the expanded region to a half of a distance between gate electrodes of transistors formed in a same element region.

6. The mask layout data creating apparatus according to claim 4, wherein the mask layout data correcting section decides that a size of the expanded region is to be not less than a minimum exposure area of an exposure apparatus.

7. A method of manufacturing a semiconductor device, comprising:

selecting a first group and a second group of transistors based on a gate length from a plurality of transistors constituting a semiconductor device;

performing a first channel impurity injection in a semiconductor substrate having the transistors of the first and second groups;

performing a second channel impurity injection in the semiconductor substrate having the transistors of the first group;

forming a gate insulation film and a gate electrode over the semiconductor substrate having the transistors of the first and second groups; and introducing impurity in the semiconductor substrate located on both sides of the gate electrode.

8. The method of manufacturing a semiconductor device according to claim 7, wherein selecting step comprises:

extracting, from a first mask layout data, an overlapping area of a gate electrode and an element region, the gate electrode having a gate length within a predetermined range;

expanding the overlapping area to generate an expanded region; and creating a second mask layout data by creating a mask data corresponding to the expanded region and by adding the mask data to the first mask layout data.

9. The method of manufacturing a semiconductor device according to claim 8, wherein the first mask layout data is used in a first facility, and the second mask layout data is used in a second facility.

10. The method of manufacturing a semiconductor device according to claim 9, wherein a concentration of impurity injected into a channel layer through the first and second channel impurity injections is decided so that a threshold voltage of the transistors of each of the first and second groups manufactured with the second facility is equal to a threshold voltage of the transistors manufactured with the first facility.

* * * * *